US009682532B2

(12) United States Patent
Kubo et al.

(10) Patent No.: US 9,682,532 B2
(45) Date of Patent: Jun. 20, 2017

(54) LAMINATED BODY AND METHOD FOR SEPARATING LAMINATED BODY

(75) Inventors: Atsushi Kubo, Kawasaki (JP); Hirofumi Imai, Kawasaki (JP); Koki Tamura, Kawasaki (JP); Takahiro Yoshioka, Kawasaki (JP); Yasushi Fujii, Kawasaki (JP); Yoshihiro Inao, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 140 days.

(21) Appl. No.: 13/880,803

(22) PCT Filed: Oct. 19, 2011

(86) PCT No.: PCT/JP2011/074048
§ 371 (c)(1),
(2), (4) Date: Apr. 22, 2013

(87) PCT Pub. No.: WO2012/056969
PCT Pub. Date: May 3, 2012

(65) Prior Publication Data
US 2014/0311680 A1    Oct. 23, 2014

(30) Foreign Application Priority Data

Oct. 29, 2010 (JP) ................................ 2010-243147
Oct. 6, 2011 (JP) ................................ 2011-221797

(51) Int. Cl.
*B32B 7/06* (2006.01)
*B32B 27/30* (2006.01)
(Continued)

(52) U.S. Cl.
CPC .................. *B32B 7/06* (2013.01); *B32B 7/12* (2013.01); *B32B 27/308* (2013.01);
(Continued)

(58) Field of Classification Search
None
See application file for complete search history.

(56) References Cited

U.S. PATENT DOCUMENTS 5,948,847 A    9/1999 Iguchi et al.
6,084,104 A *  7/2000 Nakano ................ C07D 249/20
                                                        548/259
(Continued)

FOREIGN PATENT DOCUMENTS

JP    H10-228113 A    8/1998
JP    A-2002-226796   8/2002
(Continued)

OTHER PUBLICATIONS

International Search Report issued in International Patent Application No. PCT/JP2011/074048 on Jan. 17, 2012.

*Primary Examiner* — Ronak Patel
*Assistant Examiner* — Thomas Mangohig
(74) *Attorney, Agent, or Firm* — Knobbe Martens Olson & Bear LLP

(57) ABSTRACT

A laminate including a supporting member which is light transmissive; a supported substrate which is supported by the supporting member; an adhesive layer which is provided on a surface of the supported substrate on which surface the supported substrate is supported by the supporting member; and a release layer, which (i) is provided between the supporting member and the supported substrate and (ii) contains a polymer including, in a repeating unit, a structure having a light absorption property, a property of the polymer being changed when the polymer absorbs light irradiated via the supporting member.

4 Claims, 2 Drawing Sheets

(51) Int. Cl.
    *B32B 7/12*         (2006.01)
    *B32B 43/00*      (2006.01)
    *H01L 21/683*     (2006.01)
    *H01L 31/18*      (2006.01)

(52) U.S. Cl.
CPC ........ *B32B 43/006* (2013.01); *H01L 21/6835* (2013.01); *H01L 31/1896* (2013.01); *B32B 2307/40* (2013.01); *B32B 2457/00* (2013.01); *H01L 2221/68318* (2013.01); *H01L 2221/68327* (2013.01); *H01L 2221/68381* (2013.01); *Y02E 10/50* (2013.01); *Y10T 156/1153* (2015.01); *Y10T 428/31786* (2015.04); *Y10T 428/31935* (2015.04)

(56) References Cited

U.S. PATENT DOCUMENTS

| | | | |
|---|---|---|---|
| 6,127,199 | A | 10/2000 | Inoue et al. |
| 6,372,608 | B1 | 4/2002 | Shimoda et al. |
| RE38,466 | E | 3/2004 | Inoue et al. |
| RE40,601 | E | 12/2008 | Inoue et al. |
| 2002/0146893 | A1 | 10/2002 | Shimoda et al. |
| 2003/0224582 | A1 | 12/2003 | Shimoda et al. |
| 2004/0219762 | A1 | 11/2004 | Shimoda et al. |
| 2005/0233547 | A1 | 10/2005 | Noda et al. |
| 2006/0030122 | A1 | 2/2006 | Shimoda et al. |
| 2007/0010067 | A1 | 1/2007 | Shimoda et al. |
| 2007/0224378 | A1* | 9/2007 | Takeuchi ............ B32B 7/06 428/40.1 |
| 2009/0133812 | A1 | 5/2009 | Noda et al. |
| 2009/0263631 | A1* | 10/2009 | Sakamoto et al. ...... 428/195.1 |
| 2010/0038035 | A1 | 2/2010 | Noda et al. |
| 2010/0041211 | A1 | 2/2010 | Noda et al. |
| 2011/0297771 | A1 | 12/2011 | Noda et al. |

FOREIGN PATENT DOCUMENTS

| | | |
|---|---|---|
| JP | A-2004-64040 A | 2/2004 |
| WO | WO 98/09333 A1 | 5/1998 |

\* cited by examiner

US 9,682,532 B2

LAMINATED BODY AND METHOD FOR SEPARATING LAMINATED BODY

This application is the U.S. National Phase under 35 U.S.C. §371 of International Application No. PCT/JP2011/074048, filed Oct. 19, 2011, designating the U.S., and published in Japanese as WO 2012/056969 on May 3, 2012, which claims priority to Japanese Patent Application No. 2010-243147, filed Oct. 29, 2010; and to Japanese Patent Application No. 2011-221797, filed Oct. 6, 2011. The entire content of these priority applications is incorporated herein by reference.

TECHNICAL FIELD

The present invention relates to (i) a laminated body (laminate) in which a supporting member is temporarily fixed, via a release layer, to a product which is in production and (ii) a method for separating the laminate.

BACKGROUND ART

As mobile phones, digital AV devices, IC cards and the like are highly functionalized, it is more demanded that a semiconductor silicon chip (hereafter referred to as "chip") be highly integrated in a package by making a mounted chip smaller and thinner. For instance, there is a demand for thinning an integrated circuit obtained by packaging a plurality of chips, such as CSP (chip size package) and MCP (multi-chip package). In order to fulfill high integration of a chip in a package, it is necessary to thin a chip down to a range of 25 µm to 150 µm.

However, a semiconductor wafer (hereafter referred to as "wafer") serving as a base of a chip becomes thin by grinding. Therefore, strength of the wafer decreases. This is likely to result in a crack or a warpage in the wafer. Furthermore, it is difficult to automatically carry the wafer whose strength decreases due to its smaller thickness. Therefore, it is necessary to manually carry the wafer and it is troublesome to handle the wafer.

For this reason, there has been developed a wafer handling system for reinforcement of a wafer, by which to adhere a plate called "supporting plate" which is composed of glass, hard plastic or the like, to a wafer to be ground, thereby preventing a crack and a warpage in the wafer. Since the wafer handling system can reinforce a wafer, it is possible to automatically carry a wafer having been made thinner.

In the wafer handling system, (i) a wafer and a supporting plate are adhered together with the use of various kinds of thermoplastic resins or adhesives, (ii) the wafer adhered to the supporting plate is thinned, and then (iii) the supporting plate is stripped from the wafer prior to dicing of the wafer. In order to thin the wafer to 150 µm or less, for example, it is highly preferable to firmly adhere the wafer and the supporting plate together.

CITATION LIST

Patent Literature 1
Japanese Patent Application Publication, Tokukai, No. 2004-064040 A (Publication Date: Feb. 26, 2004).
Patent Literature 2
Japanese Patent Application Publication, Tokukaihei, No. 10-228113 A (Publication Date: Aug. 25, 1998).

SUMMARY OF INVENTION

Technical Problem

However, in a case where a wafer and a supporting plate are firmly adhered together, it may be difficult to strip the supporting plate from the wafer without damaging the wafer, depending on an adhesive used. This is because, while a strong adhesive is effective in thinning a wafer, such an adhesive causes damage to the wafer having a reduced strength when the supporting plate is stripped from the wafer.

In view of the circumstances, the automation of the wafer handling system requires development of an extremely difficult temporary-fixing technique that enables, while achieving temporary and yet firm fixing of a wafer to a supporting plate, stripping of the wafer from the supporting plate without damaging the wafer.

The present invention has been made in view of the foregoing problem, and it is an object of the present invention to provide (i) a laminate configured such that a target object is firmly adhered to and supported by a supporting member but the supporting member can be easily separated from the target object and (ii) a method for separating the laminate.

Solution to Problem

A laminate of the present invention includes a supporting member which is light transmissive; a supported substrate which is supported by the supporting member; an adhesive layer which is provided on a surface of the supported substrate on which surface the supported substrate is supported by the supporting member; and a release layer, which (i) is provided between the supporting member and the supported substrate and (ii) contains a polymer including, in a repeating unit, a structure having a light absorption property, the polymer changing its property when the polymer absorbs light irradiated via the supporting member.

Advantageous Effects of Invention

The present invention makes it possible to provide, by use of the configuration described above, a laminate configured such that a target object is firmly adhered to and supported by a supporting member but the supporting member can be easily separated from the target object.

DESCRIPTION OF EMBODIMENTS

Figure 1:
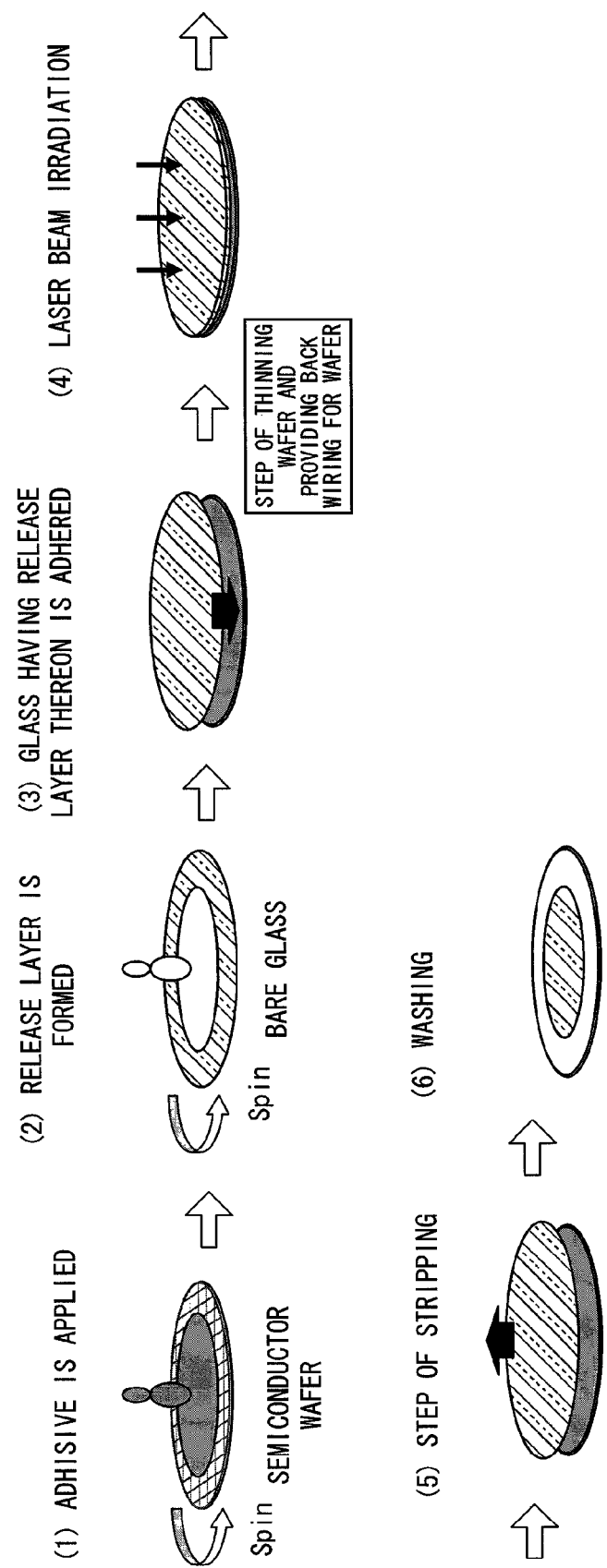
FIG. 1 is a view illustrating (i) a method for producing a laminate of the present invention and (ii) a method for separating a supporting member.

[Laminate]
One embodiment of a laminate of the present invention is discussed below.

The laminate of the present invention includes a supporting member which is light transmissive; a supported substrate which is supported by the supporting member; an adhesive layer which is provided on a surface of the supported substrate on which surface the supported substrate is supported by the supporting member; and a release layer, which (i) is provided between the supporting member and the supported substrate and (ii) contains a polymer including, in a repeating unit, a structure having a light absorption property, the polymer changing its property when the polymer absorbs light irradiated via the supporting member.

The laminate of the present invention can be used for any purpose, provided that the supported substrate is temporarily fixed to the supporting member. The present embodiment discusses an example of a laminate which is (i) for use in a wafer support system and (ii) in which a semiconductor wafer (supported substrate) is temporarily fixed to a supporting plate (supporting member).

(Release Layer)

As described above, the laminate of the present invention includes the release layer. Further, the release layer contains a polymer which includes, in a repeating unit, a structure having a light absorption property. A property change of the polymer occurs when the polymer receives light irradiated thereon. The property change of the polymer is caused in a case where the structure absorbs the light irradiated on the polymer. As a result of the property change of the polymer, the release layer loses strength or adhesiveness that the release layer had before receiving the light irradiation. Hence, it is possible to easily separate the supported substrate from the supporting member by applying a little external force (for example, by raising the supporting member).

The above-mentioned structure is a chemical structure which absorbs light, so as to change a property of a polymer including the structure as a repeating unit. The structure is, for example, an atomic group containing a conjugated pi electron system which is constituted by a benzene ring, a condensed ring, or a heterocyclic ring, each of which is substituted or unsubstituted. Specifically, the structure is (i) a cardo structure, or (ii) a benzophenone structure, a diphenyl sulfoxide structure, a bis-phenyl sulfone structure, a diphenyl structure, a diphenylamine structure, or a phenyl benzotriazole structure, each of which exists in a side chain of the polymer.

In a case where the structure exists in a side chain of the polymer, the structure can be represented by the following Formulas (1) through (5).

[Chem. 1]

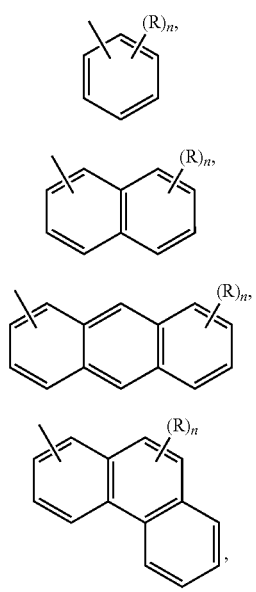

(1)
(2)
(3)
(4)

-continued

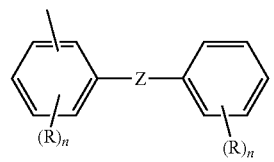

(5)

Each R is independently an alkyl group, an aryl group, a halogen, a hydroxyl group, a ketone group, a sulfoxide group, a sulfone group, or $-N(R_1)(R_2)$ (where each of $R_1$ and $R_2$ is independently a hydrogen atom or a C1-C5 alkyl group); Z is absent or is $-CO-$, $-SO_2-$, $-SO-$, or $-NH-$; and n is 0 or an integer of 1 to 5. In a case where n is 2 or more, each R is identical with each other or differs from each other.

Moreover, the polymer, for example, (i) contains a repeating unit represented by one of the following Formulas (a) through (d), (ii) is represented by Formula (e), or (iii) includes, in a main chain of the polymer, a structure of Formula (f).

[Chem. 2]

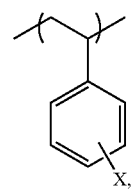

(a)

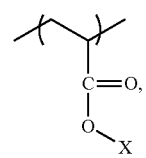

(b)

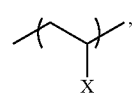

(c)

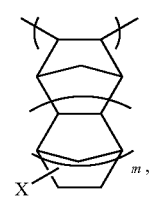

(d)

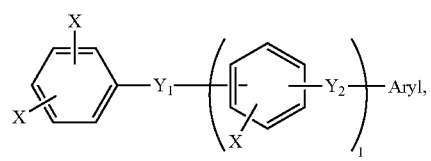

(e)

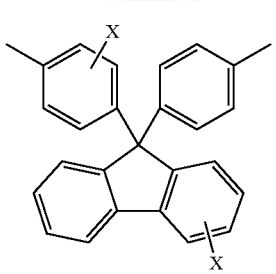

(f)

wherein 1 is an integer not less than 1; m is 0 or an integer of 1 to 2; X, in Formulas (a) through (e), (i) is one of the formulas shown in (1) through (5) of "Chem. 1" or (ii) is bound to one of the formulas shown in (1) through (5) of "Chem. 1") via a linkage constituted by a C1-C5 alkylene moiety, an ester bond, an ether bond, or a combination of the alkylene moiety, the ester bond, and ether bond; X, in Formula (f), is one of the formulas shown in (1) through (5) of "Chem. 1" or is absent; each of $Y_1$ and $Y_2$ is independently —CO— or —$SO_2$—; and 1 is preferably an integer not more than 10.

Examples of the benzene ring, the condensed ring, and the heterocyclic ring which are represented by Formulas (1) through (4) of "Chem. 1" encompass phenyl, substituted phenyl, benzyl, substituted benzyl, naphthalene, substituted naphthalene, anthracene, substituted anthracene, anthraquinone, substituted anthraquinone, acridine, substituted acridine, azobenzene, substituted azobenzene, fluorine, substituted fluorine, fluorinone, substituted fluorinone, carbazole, substituted carbazole, N-alkyl carbazole, dibenzofuran, substituted dibenzofuran, phenanthrene, substituted phenanthrene, pyrene, and substituted pyrene. In a case where substituents listed above are substituted with a certain substituent, such certain substituent is selected from, for example, alkyl, aryl, halogen atom, alkoxy, nitro, aldehyde, cyano, amide, dialkylamino, sulfonamide, imide, carboxylic acid, carboxylic acid ester, sulfonic acid, sulfonic acid ester, alkylamino, and arylamino.

Among the substituents represented by "Chem. 1," the substituent that has two phenyl groups, and Z of —$SO_2$— in Formula 5 is exemplified by bis(2,4-dihydroxyphenyl)sulfone, bis(3,4-dihydroxyphenyl)sulfone, bis(3,5-dihydroxyphenyl)sulfone, bis(3,6-dihydroxyphenyl)sulfone, bis(4-hydroxyphenyl)sulfone, bis(3-hydroxyphenyl)sulfone, bis(2-hydroxyphenyl)sulfone, bis(3,5-dimethyl-4-hydroxyphenyl)sulfone, and the like.

Among the substituents represented by "Chem. 1," the substituent that has two phenyl groups, and Z of —SO— in Formula 5 is exemplified by bis(2,3-dihydroxyphenyl)sulfoxide, bis(5-chloro-2,3-dihydroxyphenyl)sulfoxide, bis(2,4-dihydroxyphenyl)sulfoxide, bis(2,4-dihydroxy-6-methylphenyl)sulfoxide, bis(5-chloro-2,4-dihydroxyphenyl)sulfoxide, bis(2,5-dihydroxyphenyl)sulfoxide, bis(3,4-dihydroxyphenyl)sulfoxide, bis(3,5-dihydroxyphenyl)sulfoxide, bis(2,3,4-trihydroxyphenyl)sulfoxide, bis(2,3,4-trihydroxy-6-methylphenyl)-sulfoxide, bis(5-chloro-2,3,4-trihydroxyphenyl)sulfoxide, bis(2,4,6-trihydroxyphenyl)sulfoxide, bis(5-chloro-2,4,6-trihydroxyphenyl)sulfoxide, and the like.

Among the substituents represented by "Chem. 1," the substituent that has two phenyl groups, and Z of —C(=O)— is exemplified by 2,4-dihydroxybenzophenone, 2,3,4-trihydroxybenzophenone, 2,2',4,4'-tetrahydroxybenzophenone, 2,2',5,6'-tetrahydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,6-dihydroxy-4-methoxybenzophenone, 2,2'-dihydroxy-4,4'-dimethoxybenzophenone, 4-amino-2'-hydroxybenzophenone, 4-dimethylamino-2'-hydroxybenzophenone, 4-diethylamino-2'-hydroxybenzophenone, 4-dimethylamino-4'-methoxy-2'-hydroxybenzophenone, 4-dimethylamino-2',4'-dihydroxy benzophenone, 4-dimethylamino-3',4'-dihydroxy benzophenone, and the like.

Examples of the repeating unit represented by (b) in "Chem. 2," where (i) X is a substituent of Formula (1) in "Chem. 1" and (ii) one of Rs is benzotriazole encompass 2-[2'-hydroxy-5'-methacryloyloxy]ethylphenyl]-2H-benzotriazole (manufactured by Otsuka Chemical Co., Ltd., product name: RUVA-93), 2-[2'-hydroxy-5'-methacryloyloxy]phenyl]-2H-benzotriazole, 2-[2'-hydroxy-3'-t-butyl-5'-methacryloyloxy]phenyl]-2H-benzotriazole, and benzotriazole derivatives such as a compound represented by the following formula.

[Chem. 3]

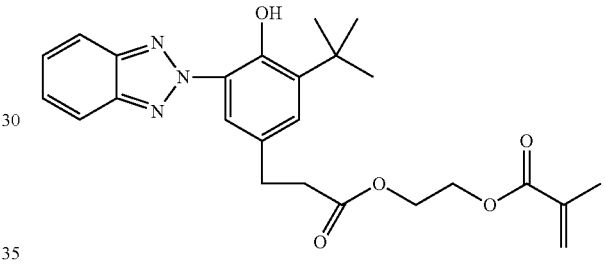

In a case where the structure exists in a side chain of the polymer, the repeating unit having the structure accounts for a percentage of the polymer in such a range that light transmittance of the release layer is 0.001% to 10%. In a case where the polymer is prepared so that the percentage is held in the range, the release layer can sufficiently absorb light, so that the property of the release layer can be securely and promptly changed. In other words, the supporting member can be easily removed from the laminate, so that it is possible to reduce light emission time required for the removal.

The structure can be designed to absorb light having a wavelength within a desired range by selecting a type of the structure. For example, a wavelength of light which is absorbable by the structure can be in a range of 100 nm to 2000 nm. Within the range, a wavelength of light which is absorbable by the structure can be in a shorter wavelength side, for example, in a range of 100 nm to 500 nm. For example, the structure can be designed to change the property of a polymer including the structure, by absorbing ultraviolet light preferably having a wavelength in a range of approximately 300 nm to 370 nm.

Examples of light which is absorbable by the structure encompass (i) light emitted from a high-pressure mercury lamp (wavelength: 254 nm to 436 nm), a KrF eximer laser (wavelength: 248 nm), an ArF eximer laser (wavelength: 193 nm), an $F_2$ eximer laser (wavelength: 157 nm), an XeCl laser (wavelength: 308 nm), an XeF laser (wavelength: 351 nm), a solid-state UV laser (wavelength: 355 nm), or (ii) g-line (wavelength: 436 nm), (iii) h-line (wavelength: 405 nm), (iv) i-line (wavelength: 365 nm), or the like.

As used herein, the term "property change" of a polymer refers to causing (i) a release layer constituted by the polymer to be destroyable by receiving a little external force or (ii) to be lower in adhesive strength with which the release layer adheres with a member in contact with the release layer. Further, property change of the polymer can be (exothermic or non-exothermic) decomposition, cross-linking, change of a steric structure, or dissociation of a functional group (and consequent hardening, degassing, contraction or expansion of the release layer), each of which is caused by an energy of light which is absorbed by the polymer. As described above, the property change of the polymer is caused as a result of an absorbance of light by the structure. Accordingly, a type of property change of the polymer can vary depending on the type of the structure thus selected.

As described above, the release layer contains the polymer having the structure as a repeating unit. This permits that the polymer may be a copolymer, if necessary, containing a repeating unit constituted by a well-known monomer. Examples of the well-known monomer encompass (meth)acrylic acid ester and acrylic alkyl ester having a C1-C14 alkyl group.

Examples of the (meth)acrylic acid ester encompass (meth)acrylic acid alkyl ester having a chain structure, (meth)acrylic acid ester having an aliphatic ring, and (meth)acrylic acid ester having an aromatic ring. Examples of the (meth)acrylic acid alkyl ester having a chain structure encompass acrylic long chain alkyl ester having a C15-C20 alkyl group and acrylic alkyl ester having a C1-C14 alkyl group. Examples of the acrylic long chain alkyl ester encompass (meth)acrylic acid alkyl ester whose alkyl group is an n-pentadecyl group, an n-hexadecyl group, an n-heptadecyl group, an n-octadecyl group, an n-nonadecyl group, an n-eicosyl group, or the like. The alkyl group may be branched.

Examples of the (meth)acrylic acid ester having an aliphatic ring encompass cyclohexyl (meth)acrylate, cyclopentyl (meth)acrylate, 1-adamantyl (meth)acrylate, norbornyl (meth)acrylate, isobornyl (meth)acrylate, tricyclodecenyl (meth)acrylate, tetracyclododecanyl (meth)acrylate, and dicyclopentadienyl (meth)acrylate. In particular, isobornyl methacrylate and dicyclopentadienyl (meth)acrylate are more preferable.

Examples of the acrylic alkyl ester having a C1-C14 alkyl group encompass well-known acrylic alkyl esters used in existing acrylic adhesives. Examples of the well-known acrylic alkyl esters encompass (meth)acrylic acid alkyl ester whose alkyl group is a methyl group, an ethyl group, a propyl group, a butyl group, a 2-ethylhexyl group, an isooctyl group, an isononyl group, an isodecyl group, a dodecyl group, a lauryl group, a tridecy group, or the like.

Moreover, in a case where a release layer is formed, if necessary, it is possible to use a solution in which the polymer is diluted by use of an organic solvent.

Examples of the organic solvent encompass lactone groups (e.g., γ-butyrolactone); ketone groups (e.g., acetone, methyl ethyl ketone (MEK), cyclohexanone, methyl-n-pentyl ketone, methyl isopentyl ketone, or 2-heptanone); polyvalent alcohol groups (e.g., ethylene glycol, diethylene glycol, propylene glycol, or dipropylene glycol); polyvalent alcohol group derivatives (e.g., compounds having an ether bond); cyclic ether groups (e.g., dioxane), or ester groups (e.g., methyl lactate, ethyl lactate (EL), methyl acetate, ethyl acetate, butyl acetate, methyl pyruvate, ethyl pyruvate, methoxy methyl propionate, or ethoxy ethyl propionate); aromatic organic solvents (e.g., anisole, ethyl benzyl ether, cresyl methyl ether, diphenyl ether, dibenzyl ether, phenetole, butyl phenyl ether, ethylbenzene, diethylbenzene, pentylbenzene, isopropyl benzene, toluene, xylene, cymene, or mesitylene), and dimethylsulfoxide (DMSO). Examples of the compounds having the ether bond encompass (i) compounds having an ester bond (e.g., ethylene glycol monoacetate, diethylene glycol monoacetate, propylene glycol monoacetate, or dipropylene glycol monoacetate), (ii) (a) monoalkyl ethers or (b) monophenyl ethers of the polyvalent alcohol group, and (iii) (A) monoalkyl ethers or (B) monophenyl ethers of the compounds having an ester bond. Examples of the monoalkyl ether encompass monomethyl ether, monoethyl ether, monopropyl ether, and monobutyl ether. Among these compounds, propylene glycol monomethyl ether acetate (PGMEA) and propylene glycol monomethyl ether (PGME) are preferable. Each type of the organic solvents can be used sole or in combination as a mixture of two or more types of the organic solvents.

It is preferable that the release layer is provided between the supporting member and the adhesive layer. In other words, a configuration in which the adhesive layer is provided between the release layer and the supported substrate is preferable. Such a configuration can prevent light irradiated to the release layer via the supporting member from reaching the supported substrate. In a case where, for example, a surface of the supported substrate, which surface contacts with the adhesive layer has a microstructure to be protected, it is possible to prevent the microstructure from receiving a harmful influence due to the light irradiation.

A thickness of the release layer can be within a range of 0.1 μm to 10 μm. The thickness of the release layer is preferably within a range of 0.4 μm to 5 μm. In a case where the thickness of the release layer is within the range of 0.4 μm to 5 μm, it is possible to change the property of the release layer as desired by irradiating light for a short time or irradiating low-energy light.

As described above, the release layer is formed between the supporting member and the supported substrate. Further, the release layer is constituted so as to change its property by receiving light irradiation via the supporting member. The laminate of the present invention may further include another layer between the release layer and the supporting member. In this case, the another layer is constituted by a material which transmits light. This makes it possible to appropriately add a layer which gives, for example, a preferable property to the laminate without preventing a light incidence to the release layer. A wavelength of light which can change the property of the polymer varies depending on a type of the polymer constituting the release layer. Accordingly, a material constituting the another layer does not need to be transmissive to light in all wavelengths. Thus, the material constituting the another layer can be appropriately selected from a material which is transmissive to light in a wavelength with which the polymer can be changed in property.

As described above, the release layer includes the polymer having the structure as a repeating unit. Further, the release layer may contain a component other than the polymer. Examples of the component encompass filler, a plasticizer, and a component which can increase strippability of the supporting member. Such a component is appropriately selected from a conventionally well-known substance or material which (i) does not prevent or (ii) promote light absorbance by the structure and property change of the polymer.

(Supporting Member)

As described above, the supporting member is light transmissive. The purpose of this is to cause light irradiated from outside of the laminate to go through the supporting member and reach the release layer. Accordingly, the supporting member does not always need to be transmissive to light in all wavelengths but should be transmissive to light to be absorbed by the release layer (light having a desired wavelength).

Moreover, the supporting member is a configuration for supporting the supported substrate. As such, the supporting member is merely required to have an enough strength to prevent the supported substrate from being damaged or deformed during, for example, processing or transportation of the supported substrate.

From the point of view described above, examples of the supporting member encompass a glass plate and an acrylic plate. However, the supporting member may be anything that can achieve the purpose of the supporting member.

(Adhesive Layer)

An adhesive layer is a configuration for (i) adhering to fix the supported substrate to the supporting member and (ii) simultaneously covering a surface of the supported substrate so as to protect the surface of the supported substrate. Thus, the adhesive layer needs to have adhesiveness and strength for holding a fixation of the supported substrate to the supporting member and covering of a surface to be protected of the supported substrate, during processing or transportation of the supported substrate. Meanwhile, it is necessary that the adhesive layer can be easily stripped or removed from the supported substrate when the fixation of the supported substrate to the supporting member becomes unnecessary.

Accordingly, the adhesive layer is constituted by an adhesive which normally has strong adhesiveness, and (i) whose adhesiveness is deteriorated by a certain processing or (ii) which adhesive has solubility in a given solvent. Various adhesives which are well known in the field to which the present invention pertains can be used as an adhesive constituting the adhesive layer for the present invention.

It is preferable to form the adhesive layer by use of a resin other than a light curing resin (e.g., UV hardening resin). This is because after the adhesive layer is stripped or removed, the light curing resin can remain as a residue in an area about microasperities of the supported substrate. In particular, an adhesive which is dissolved in a given solvent is preferable as a material constituting the adhesive layer. This is because such an adhesive is removable by dissolving the adhesive layer in the solvent without applying a physical force to the supported substrate. This allows to perform the removal of the adhesive layer even to a supported substrate lowered in strength, in such a way that the adhesive layer can be easily removed from the supported substrate without damaging or deforming the supported substrate.

[Method for Producing Laminate]

The following description will discuss, with reference to FIG. 1, a method for producing the laminate of the present invention. FIG. 1 is a view illustrating (i) the method for producing the laminate and (ii) a process of separating a semiconductor wafer from the laminate.

First, as illustrated in FIG. 1, an adhesive is spin-coated, in a semiconductor wafer (supported substrate) on which a desired element is formed, on a surface on which the desired element is formed ((1) of FIG. 1). The adhesive is applied to the semiconductor wafer in a state in which the adhesive is dissolved in a solvent, for example. Then, the adhesive is stepwise baked by increasing a temperature, so as to be hardened, thereby forming an adhesive layer.

Then, the polymer which is dissolved in the solvent is spin-coated on a surface of a bare glass (supporting member) ((2) of FIG. 1). The solvent is evaporated, so that the polymer is turned into solid, and thus a release layer is formed.

The release layer which is formed on the surface of the bare glass is adhered to the adhesive layer which is formed on the surface of the semiconductor wafer ((3) of FIG. 1). Here, the adhesive layer and the release layer are adhered together by causing the release layer to contact with the adhesive layer and pressurizing the release layer and the adhesive layer at 200° C. under vacuum.

In this way, the laminate of the present invention can be produced. Note that preferable methods are appropriately selected, from various conventional well-known methods, as (i) a method for forming the adhesive layer and the release layer and (ii) a method for adhering the adhesive layer and the release layer together, in accordance with a state of the supported substrate (e.g., asperity of a surface, strength), a material of the adhesive layer, a material of the release layer, a material of the supporting member, and the like.

It may be arranged such that, after a processing of the semiconductor wafer is completed, the laminate is processed into solely the semiconductor wafer by light irradiation, stripping the bare glass, and removing the adhesive layer. A process from a completion of the processing of the semiconductor wafer to a removal of the semiconductor wafer is discussed below.

[Method for Separating Laminate]

Figure 2:
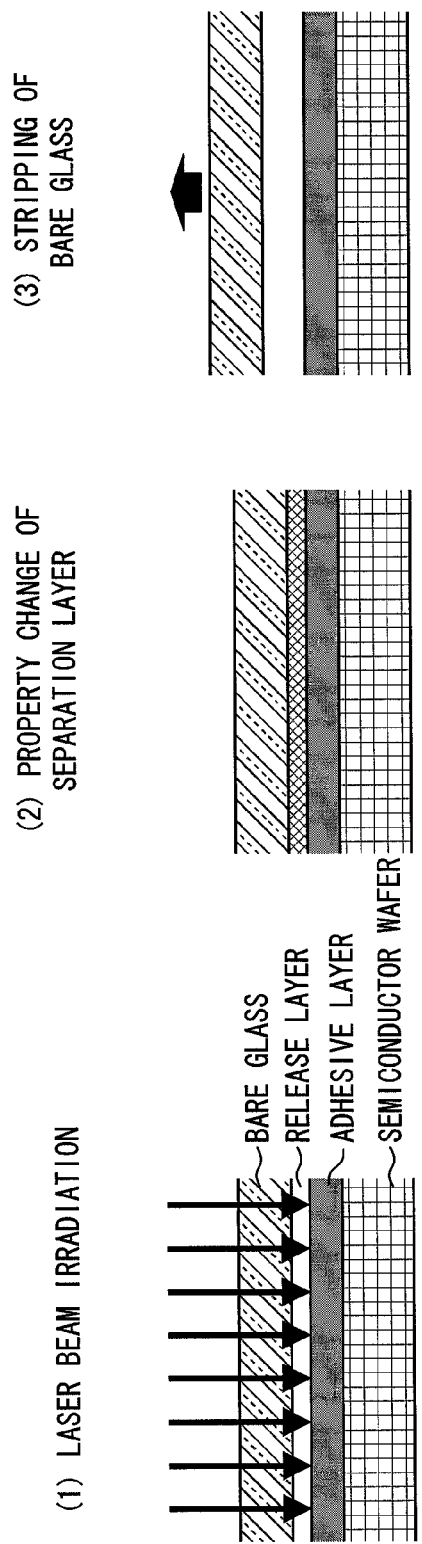
FIG. 2 is a view illustrating details of a process of separating the supporting member.

As illustrated in FIG. 1, after the processing of the semiconductor wafer is completed, a laser beam is irradiated on the laminate from above the supporting member ((4) of FIG. 1). Upon receiving the laser beam thus irradiated ((1) of FIG. 2), the property of the release layer is changed ((2) of FIG. 2). Here, the method is described, assuming that the property change is decomposition of the polymer contained in the release layer.

Then, the bare glass is stripped from the semiconductor wafer ((5) of FIG. 1). Strength of the release layer whose property has been changed is greatly deteriorated. Accordingly, the release layer is easily destroyed, for example, by applying a little external force and raising the bare glass, so that the bare glass is stripped from the laminate ((3) of FIG. 2).

The adhesive layer is removed by spraying a solvent to the adhesive layer which is remained ((6) of FIG. 1). Here, there is a case where a residue of the release layer is adhered to the adhesive layer after the bare glass is stripped. In a case where only a small amount of the release layer is adhered to the adhesive layer, as described above, a solvent for dissolving the adhesive layer should be sprayed. However, before spraying the solvent for dissolving the adhesive layer, it is also possible to spray a solvent for dissolving a material of the release layer.

As has been described, the laminate of the present invention has the release layer described above. For this reason, it is possible to easily strip the supporting member from the supported substrate by light irradiation.

EXAMPLES

The following description will discuss examples of a laminate in accordance with the present invention. Note that the following examples serve solely to assist the understanding of the present invention, and do not in any way limit the scope of the present invention.

[Preparation of Laminate]

A laminate in Example 1 was prepared as described below. Resin 1 having a cardo structure in a repeating unit was dissolved in propylene glycol monomethyl ether acetate (PGMEA) so as to prepare a solution in which a content of the resin 1 in the solution was 20% by weight. The solution was spin-coated in a thickness of 5 μm on a glass supporting member (product name: "TENPAX," manufactured by SCHOTT AG). Then, a solvent was evaporated from the solution by heating the solution at 160° C. for 6 minutes, so as to obtain a glass supporting member on which a release layer in a thickness of 10000 Å was formed.

A cycloolefin polymer TOPAS8007X10 (manufactured by Polyplastic) was dissolved in p-menthane so as to prepare a solution in which a content of TOPAS8007X10 in the solution was 25% by weight. Further, 5 parts by weight of an antioxidant IRGANOX1010 (manufactured by BASF SE) was added to the solution. The solution was spin-coated on a semiconductor wafer substrate so as to have a thickness of 50 μm after being baked. Then, the solution was stepwise baked at 100° C., 160° C., and 220° C., respectively, so that an adhesive layer was formed on the semiconductor wafer substrate. The release layer and the adhesive layer were adhered together so as to face each other. In this way, a laminate was prepared.

Laminates in Examples 2 and 3 and Comparative Examples 1 and 2 were prepared in the same manner as the laminate in Example 1, except for a type of resin constituting the release layer and a thickness of the release layer. In Examples 2 and 3, the type of resin constituting the release layer was resin 2 (having a benzophenone structure in a repeating unit) and the thickness of the release layer was 4000 Å. In Comparative Examples 1 and 2, the type of resin constituting the release layer was resin 4 and the thickness of the release layer was 10000 Å.

A laminate in Example 4 was prepared as described below. Resin 3 was dissolved in a toluene/methyl ethyl ketone so as to prepare a solution in which a content of the resin 3 in the solution was 10% by weight. The solution was spin-coated on a glass supporting member (product name: "EAGLE2000," manufactured by Corning Incorporated). Then, a solvent was evaporated from the solution by heating the solution at 160° C. for 6 minutes, so as to obtain a glass supporting member on which a release layer in a thickness of 10000 Å was formed. Note that a plurality of laminates were prepared in each of Examples and Comparative Examples.

The resin 1 (Mw=4000, Mw/Mn=3.3) in Example 1 is represented by the following Formula (6), and the resin 2 (Mw=520, Mw/Mn=2.46, o:p=60:40 (molar ratio)) in Examples 2 and 3 is represented by the following Formula (7). Further, the resin 3 (Mw=50000, Mw/Mn=7.41, q:r=55:45 (molar ratio)) in Example 4 is represented by the following Formula (8), and the resin 4 (Mw=40000, Mw/Mn=7.0, a:b:c:d:e=13:10:15:52 (molar ratio)) in Comparative Examples 1 and 2 are represented by the following Formula (9).

[Chem. 4]

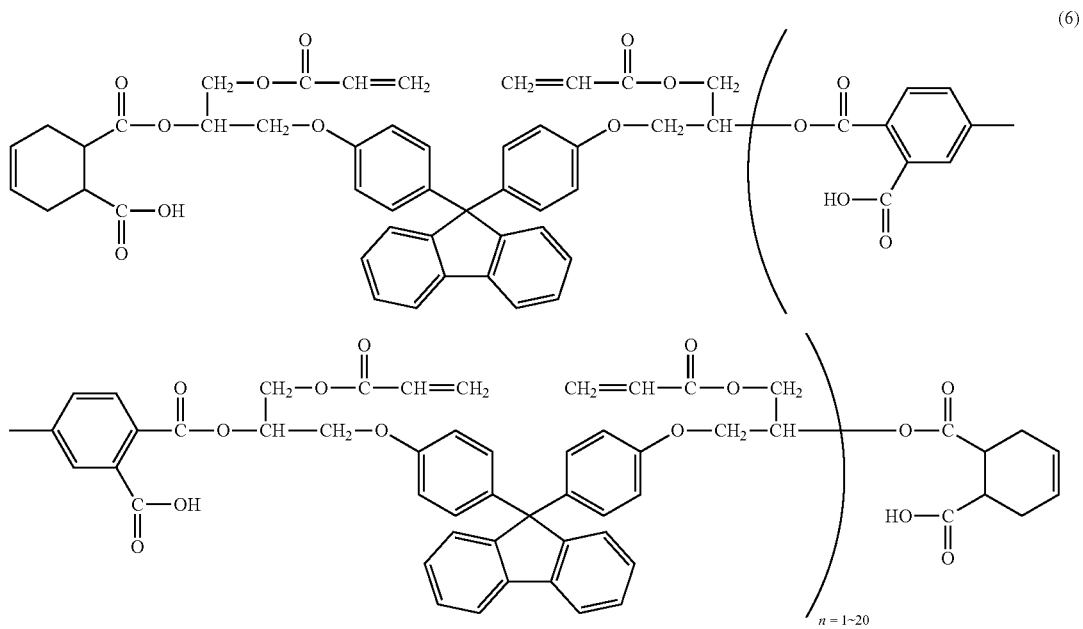

[Chem. 5]

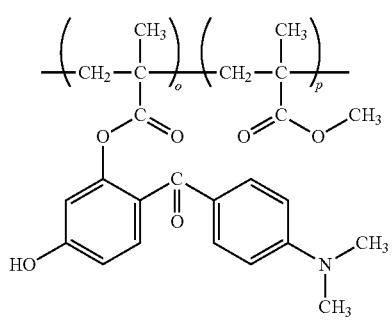

(7)

[Chem. 6]

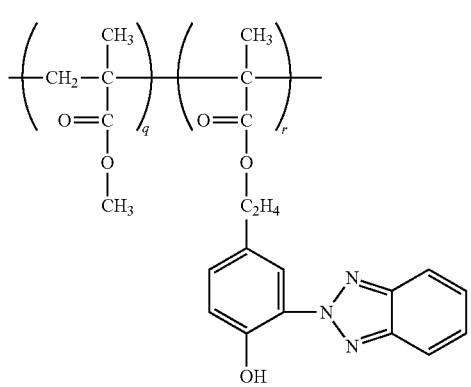

(8)

[Chem. 7]

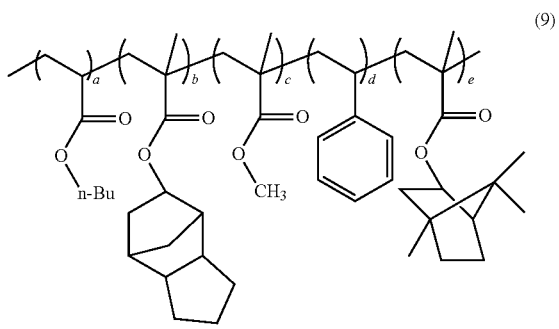

(9)

[Evaluation of Release Layer]

(Measurement of Light Transmittance)

As described below, light transmittance of release layers each of which was constituted by one of the resins 1 through 4 was measured.

Each of the resins 1 through 4 was dissolved in PGMEA so as to prepare 4 types of resin solutions, each of which had a solid content of 10% by weight. One of the 4 types of resin solutions was spin-coated on the glass substrate (EAGLE2000, manufactured by Corning Incorporated) and heated, so that a solvent is evaporated from the solution. This operation was carried out for each of the 4 types of resin solutions, so as to prepare a release layer having a film thickness of 4000 Å or 10000 Å, corresponding to each of the release layers of Examples 1 through 4 and Comparative Examples 1 and 2. Transmittance of light (308 nm or 355 nm) of each of the release layers was measured by means of a spectrophotometer (UV3100PK, manufactured by Shimadzu Corporation).

(Evaluation of Strippability)

The laminates in each of Examples and Comparative Examples were evaluated whether or not the glass supporting member was stripped from the semiconductor wafer substrate after the following processing was carried out.

Each of semiconductor substrates of the laminates thus obtained was thinned. Then, a laser beam having a wavelength of 308 nm or 355 nm was irradiated to the release layer from above a glass supporting member of the laminate. In other words, a laser beam of 308 nm was irradiated to the laminate by combining a cyclic frequency selected from a range of 12.5 Hz to 50 Hz and an energy density of 180 mJ/cm$^2$, 160 mJ/cm$^2$, 140 mJ/cm$^2$, and 120 mJ/cm$^2$, respectively. Further, a laser beam of 355 nm was irradiated to the laminate on condition of a cyclic frequency of 10 kHz to 200 kHz and an average output of 0.3 W. The laser beam was irradiated to each of the laminates for less than one minute.

The following table shows evaluation of each of the release layers as to (i) light transmittance and (ii) strippability after the laser beam was irradiated.

TABLE 1

| | Resin | Film thickness (Å) | Wavelength (nm) | Transmittance (%) | Strippability |
|---|---|---|---|---|---|
| Example 1 | Resin 1 | 10000 | 308 | 1.1 | good |
| Example 2 | Resin 2 | 4000 | 308 | 0.7 | good |
| Example 3 | Resin 2 | 4000 | 355 | 0.01 | good |
| Example 4 | Resin 3 | 10000 | 355 | 0.5 | good |
| Comparative Example 1 | Resin 4 | 10000 | 308 | 95.8 | poor |
| Comparative Example 2 | Resin 4 | 10000 | 355 | 80 | poor |

The property of the release layer of each of the laminates in Examples 1 through 4 was changed as a result of receiving the laser beam, and the glass supporting member was easily stripped from the semiconductor wafer substrate by merely raising the glass supporting member. Meanwhile, the property of the release layer of each of the laminates in Comparative Examples 1 and 2 was not changed even after receiving the laser beam, and the glass supporting member was not stripped from the semiconductor wafer substrate. Laser beam transmittance of the release layer corresponding to each of Examples was less than 10%, and the laser beam transmittance of the release layer corresponding to each of Comparative Examples was not less than 80%.

As to the resin 3 represented by Formula (8), a positive result was obtained, as same as Example 4, in a case where q+r equals 100% by weight, and r>40% by weight is satisfied. Here, the resin 3 represented by Formula (8) satisfies Mw=30000 to 150000.

In the laminate of each of Examples, after the glass supporting member was stripped from the semiconductor wafer substrates, removal of the adhesive layer was attempted. Since residues of the release layer whose property has been changed were adhered to the adhesive layer, the residues were removed by spraying a first stripping solution (PGMEA). Then, the adhesive layer was removed by spraying a second stripping solution (p-menthane). Through these processes, the semiconductor wafer substrate was completely separated from the laminate without leaving residues and the like. It was acknowledged that since an amount of the residues of the release layer which residues were adhered to the adhesive layer was small, the residues of the release layer would be easily removed together with the adhesive layer by spraying the second stripping solution only but not the first stripping solution.

As described above, the release layer which is provided in each of the laminates of Examples 1 through 4 is constituted by a resin containing, in a repeating unit, a cardo structure, a benzophenone structure, or a phenyl benzotriazole structure. Thus, the property of the release layer of each of the laminates was changed when the release layer received the laser beam, whereby the release layer was easily stripped from the laminate. Further, the adhesive layer which was remained was easily removed, and the members of the laminate were entirely removed, except for the semiconductor wafer substrate which did not require a support of the glass supporting member anymore. Meanwhile, it was not possible to remove the semiconductor wafer substrate from the laminate of each of Comparative Examples.

INDUSTRIAL APPLICABILITY

According to the present invention, it is possible to provide a temporarily fixed laminate for use in production of various products. Particularly, it is possible to provide a laminate suitable for a step of temporarily fixing a semiconductor wafer or a chip on a variety of supporting members and processing the semiconductor wafer or the chip.

What is claimed is:
1. A laminate comprising:
   a supporting member which is light transmissive;
   a supported substrate which is supported by the supporting member;
   an adhesive layer which is provided on a surface of the supported substrate on which surface the supported substrate is supported by the supporting member; and
   a release layer, which (i) is provided between the supporting member and the supported substrate and (ii) contains a polymer including, in a repeating unit, a structure having a light absorption property, wherein
   a property of the polymer is changed when the polymer absorbs light irradiated via the supporting member,
   the repeating unit, the polymer, or the structure is represented by one of the following formulas:

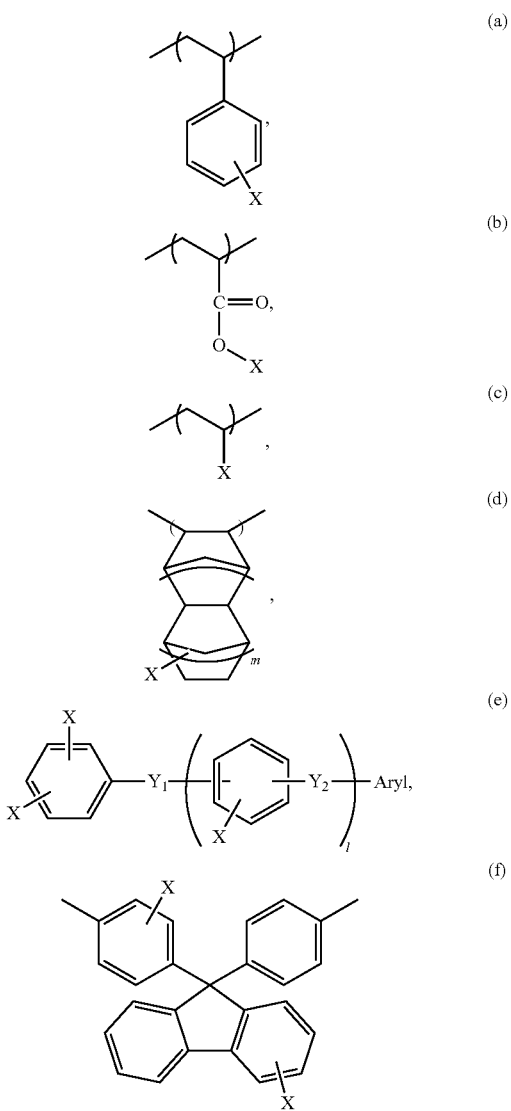

wherein 1 is an integer not less than 1; m is 0 or an integer of 1 to 2; X, in Formulas (a) through (e), (i) is one of the following Formulas (1), (3), (4) and (5) or (ii) is bound to one of the following Formulas (1), (3), (4) and (5) via a linkage constituted by a C1-C5 alkylene moiety, an ester bond, an ether bond, or a combination of the C1-C5 alkylene moiety, the ester bond, and the ether bond; X, in Formula (f), is one of the following Formulas (1), (2), (3), (4), and (5) or is absent;

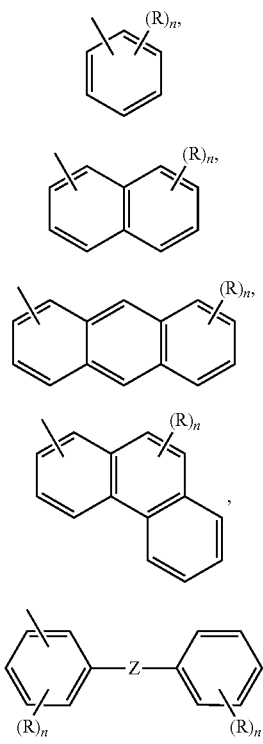

each R is independently an alkyl group, an aryl group, a halogen, a hydroxyl group, a ketone group, a sulfoxide group, a sulfone group, or —N(R$_1$)(R$_2$), where each of R$_1$ and R$_2$ is independently a hydrogen atom or a C1-C5 alkyl group; each of Y$_1$ and Y$_2$ is independently —CO— or —SO$_2$—; Z is absent or is —CO—, —SO$_2$—, or —SO—; and n is 0 or an integer of 1 through 5, the polymer containing the structure represented by the Formula (f) contains the structure in the main chain of the polymer, and with the proviso that in the repeating unit represented by the Formula (b),
  (i) when X is the Formula (5),
    (ia) each R is independently an aryl group, a halogen, a ketone group, a sulfoxide group, or a sulfone group; Z is absent or is —SO—; and n of (R)$_n$ in the left phenyl group of the Formula (5) is 5, or
    (ib) each R is independently a halogen, a hydroxyl group, a ketone group, a sulfoxide group, a sulfone group, or —N(R$_1$)(R$_2$); Z is —CO—, —SO$_2$—, —SO—, or —NH—; and n is 1 or 4, or
  (ii) when X is bound to the Formula (5) via a linkage constituted by an ester bond, an ether bond, or a combination of a C1-C5 alkylene moiety, the ester bond, and the ether bond, each R is independently a halogen, a hydroxyl group, a ketone group a sulfoxide group, a sulfone group, or —N(R$_1$)(R$_2$); Z is —CO—, —SO$_2$—, —SO—, or —NH—; and n is 1 or 4.

2. The laminate as set forth in claim 1, wherein: the structure absorbs light of a wavelength in a range of 300 nm to 370 nm.

3. The laminate as set forth in claim 1, wherein: the release layer is provided between the supporting member and the adhesive layer.

4. A method for separating the supporting member from the supported substrate of the laminate as set forth in claim 1, comprising irradiating light to the release layer via the supporting member so as to change the property of the polymer.

* * * * *

UNITED STATES PATENT AND TRADEMARK OFFICE
CERTIFICATE OF CORRECTION

PATENT NO. : 9,682,532 B2
APPLICATION NO. : 13/880803
DATED : June 20, 2017
INVENTOR(S) : Atsushi Kubo et al.

Page 1 of 1

It is certified that error appears in the above-identified patent and that said Letters Patent is hereby corrected as shown below:

In Column 18 at Line 10 (approx.), In Claim 11, after "that" insert --,--.

Signed and Sealed this
Thirty-first Day of October, 2017

Joseph Matal
*Performing the Functions and Duties of the
Under Secretary of Commerce for Intellectual Property and
Director of the United States Patent and Trademark Office*